US 10,412,865 B2
(45) Date of Patent: Sep. 10, 2019

(12) United States Patent
Miyao (10) Patent No.: US 10,412,865 B2
(45) Date of Patent: Sep. 10, 2019

(54) VEHICLE ELECTRICAL APPARATUS

(71) Applicant: SUBARU CORPORATION, Tokyo (JP)

(72) Inventor: Yosuke Miyao, Tokyo (JP)

(73) Assignee: SUBARU CORPORATION, Tokyo (JP)

( * ) Notice: Subject to any disclaimer, the term of this patent is extended or adjusted under 35 U.S.C. 154(b) by 0 days.

(21) Appl. No.: 15/869,265

(22) Filed: Jan. 12, 2018

(65) Prior Publication Data

US 2018/0242479 A1    Aug. 23, 2018

(30) Foreign Application Priority Data

Feb. 17, 2017   (JP) ................................ 2017-028012

(51) Int. Cl.
| | |
|---|---|
| *H05K 9/00* | (2006.01) |
| *H02J 7/00* | (2006.01) |
| *H05K 5/02* | (2006.01) |
| *B60L 53/22* | (2019.01) |
| *B60R 16/02* | (2006.01) |
| *B60R 25/24* | (2013.01) |

(52) U.S. Cl.
CPC ............ *H05K 9/0049* (2013.01); *B60L 53/22* (2019.02); *H02J 7/0042* (2013.01); *H05K 5/0247* (2013.01); *B60R 16/02* (2013.01); *B60R 25/24* (2013.01)

(58) Field of Classification Search
CPC .... H05K 9/0049; H05K 5/0247; B60R 16/02; B60R 25/24; H02J 7/0042
USPC .................................................. 361/816, 818
See application file for complete search history.

(56) References Cited

U.S. PATENT DOCUMENTS

| | | | | |
|---|---|---|---|---|
| 9,077,019 | B2 * | 7/2015 | Kosaki ................ | H01M 2/1077 |
| 9,214,658 | B2 * | 12/2015 | Lee ...................... | H01M 2/1077 |
| 2006/0202905 | A1 * | 9/2006 | Inaba ................... | H01Q 1/1214 |
| | | | | 343/882 |

(Continued)

FOREIGN PATENT DOCUMENTS

| | | |
|---|---|---|
| JP | 2001-294048 A | 10/2001 |
| JP | 2004-196134 A | 7/2004 |

(Continued)

OTHER PUBLICATIONS

Notification of Reason for Refusal dated Aug. 7, 2018 during the prosecution of Japanese Patent Application No. 2017-028012.

*Primary Examiner* — Hung S. Bui
(74) *Attorney, Agent, or Firm* — Troutman Sanders LLP (57) ABSTRACT

A vehicle electric apparatus installed in an extra-cabin space in a vehicle includes an electric circuit unit and a metal housing. The electric circuit unit includes a switching unit configured to switch a direct-current voltage. The metal housing houses the electric circuit unit. The metal housing includes multiple housing parts, and adjacent housing parts out of the multiple housing parts are secured to one another at multiple securing positions with respective bar-shaped securing members. An axial direction of at least one bar-shaped securing member out of the bar-shaped securing members used for at least one securing position out of the multiple securing positions is set so as to orient toward an outside of a cabin an emission direction of an electromagnetic wave from the electric circuit unit through the at least one bar-shaped securing member.

4 Claims, 7 Drawing Sheets

(56) References Cited

U.S. PATENT DOCUMENTS

| | | | | |
|---|---|---|---|---|
| 2008/0049949 A1* | 2/2008 | Snider | ............... | H04B 1/082 |
| | | | | 381/86 |
| 2009/0166116 A1* | 7/2009 | Kiya | ............... | B60K 1/04 |
| | | | | 180/68.5 |
| 2011/0176281 A1* | 7/2011 | Ikemoto | ............... | B60L 3/0046 |
| | | | | 361/729 |
| 2015/0048675 A1* | 2/2015 | Fujii | ............... | H05K 9/0037 |
| | | | | 307/10.1 |

FOREIGN PATENT DOCUMENTS

| | | |
|---|---|---|
| JP | 2008-080930 A | 4/2008 |
| JP | 2015-76448 A | 4/2015 |

\* cited by examiner

LEFT ←——→ RIGHT

REAR ←→ FRONT

FIG. 7B

LEFT ←→ RIGHT

FIG. 8

REAR ←→ FRONT

VEHICLE ELECTRICAL APPARATUS

CROSS-REFERENCE TO RELATED APPLICATIONS

The present application claims priority from Japanese Patent Application No. 2017-028012 filed on Feb. 17, 2017, the entire contents of which are hereby incorporated by reference.

BACKGROUND

1. Technical Field

The present invention relates to a vehicle electric apparatus that includes an electric circuit unit generating switching noise such as, for instance, an electric circuit unit configured to charge an onboard battery in an electric vehicle and, in particular, relates to a technique addressing electromagnetic wave noise emitted from the electric circuit unit.

2. Related Art

Some vehicles such as automobiles include a system that allows, for instance, doors to be locked/unlocked and an engine to be started (a vehicle control system to be started up) without use of a mechanical key. Hereafter, the system that at least allows doors to be locked/unlocked without use of a mechanical key is referred to as a "keyless system".

With the keyless system, a user such as a driver holding an electronic key approaches a vehicle and, in this state, for instance, the user operates an operating device such as a button provided in a door knob or the like of the vehicle so as to unlock the door. In so doing, when the keyless system becomes ready to communicate with the electronic key through an antenna provided in the vehicle, the keyless system performs a specified authentication process by communicating signals with the electronic key. On condition that the authentication is established, unlocking of the door corresponding to the above-described operation is performed.

Furthermore, when the electronic key becomes ready for communication through the antenna provided in a cabin, the keyless system starts up the vehicle control system corresponding to a specified operation such as, for instance, operating of a start button provided in the vehicle on condition that the authentication is established.

There are electric vehicles such as hybrid electric vehicles (HEVs) and plug-in HEVs (PHEVs).

A high-voltage battery as a power source of a traction motor is installed in the electric vehicle. In one example, the high-voltage battery may serve as an "onboard battery". Furthermore, an electric circuit unit is mounted on the electric vehicle. The electric circuit unit includes, for instance, a charging circuit that charges the high-voltage battery, an inverter circuit used for driving the traction motor, and a direct-current to direct-current (DC/DC) converter that steps down a supply voltage from the high-voltage battery to obtain a power source voltage (for instance, 12 V system) for auxiliary devices.

Here, the electric circuit unit which includes a switching unit that switches the direct-current voltage becomes a source of electric noise. Thus, in the electric vehicle that includes the keyless system, radio wave receiver sensitivity of the electronic key is degraded near the electric circuit unit due to electromagnetic wave noise. For instance, even communication with the electronic key positioned in the cabin is not necessarily able to be performed (the electronic key may be lost) near the electric circuit unit. This induces malfunctioning of the keyless system such failure of locking/unlocking of the door or starting up of the vehicle control system that would otherwise be successfully performed.

Techniques for shielding against electromagnetic wave noise emitted from a vehicle electric apparatus are disclosed in Japanese Unexamined Patent Application Publication (JP-A) No. 2001-294048, JP-A No. 2015-76448, and JP-A No. 2004-196134.

However, it is difficult to completely prevent emission of electromagnetic wave noise only with a shield provided in the vehicle electric apparatus in a vehicle that includes the keyless system.

SUMMARY OF THE INVENTION

It is desirable to prevent malfunctioning of a keyless system caused by electromagnetic wave noise emitted from a vehicle electric apparatus.

An aspect according to the present invention provides a vehicle electric apparatus that is to be installed in an extra-cabin space in a vehicle and includes an electric circuit unit and a metal housing. The electric circuit unit includes a switching unit configured to switch a direct-current voltage. The metal housing houses the electric circuit unit. The metal housing includes multiple housing parts, and adjacent housing parts out of the multiple housing parts are secured to one another at multiple securing positions with respective bar-shaped securing members. An axial direction of at least one bar-shaped securing member out of the bar-shaped securing members used for at least one securing position out of the multiple securing positions is set so as to orient toward an outside of a cabin an emission direction of an electromagnetic wave from the electric circuit unit through the at least one bar-shaped securing member.

DETAILED DESCRIPTION

A vehicle electric apparatus 1 as an example according to the present invention will be described below with reference to the drawings.

Figure 1:
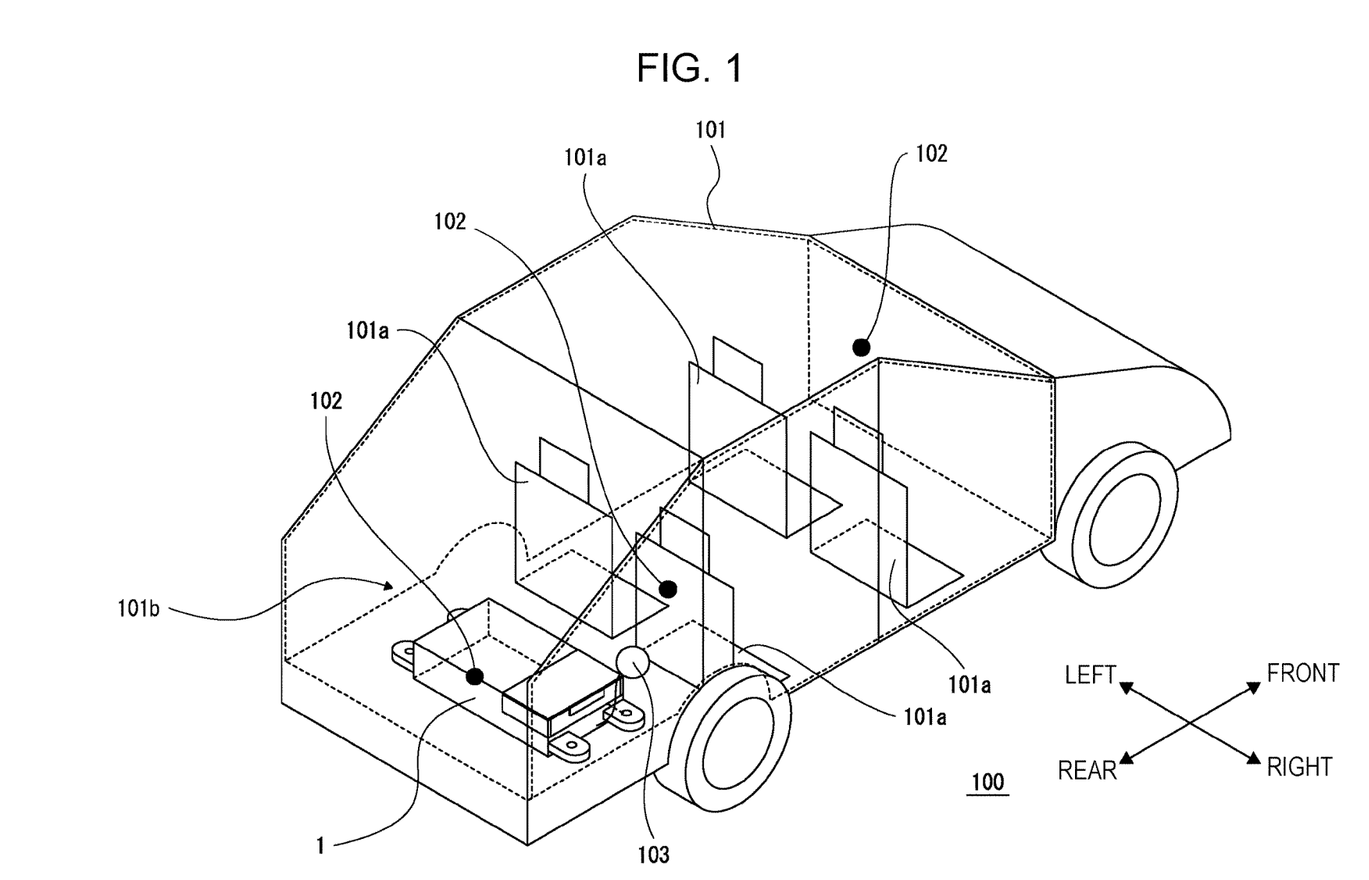
FIG. 1 is a schematic external perspective view of a vehicle that includes a vehicle electric apparatus according to an example of the present invention.

FIG. 1 is a schematic external perspective view of a vehicle 100 that includes the vehicle electric apparatus 1. In FIG. 1, part of an inner structure of the vehicle 100 is seen through an outer structure of the vehicle 100.

The vehicle 100 is, for instance, a four-wheel automobile that is an electric vehicle that includes a traction motor (not illustrated) as a drive source of wheels. According to the present example, the vehicle 100 is a hybrid electric vehicle (HEV) that includes a traction motor and an engine as drive sources of wheels.

An onboard battery 4 (not illustrated in FIG. 1) used as a power source of the traction motor is installed in the vehicle 100. The onboard battery 4 can be charged by power supplied from an external power source. That is, the vehicle 100 according to the present example is configured as a so-called plug-in HEV (PHEV).

The vehicle 100 according to the present example includes a so-called keyless system for which multiple cabin antennae 102 are disposed in a cabin 101 where multiple seats 101a are disposed.

Here, the term "keyless system" refers to a system that at least allows doors to be locked/unlocked without use of a mechanical key. The keyless system according to the present example also allows a vehicle control system to start up without use of a mechanical key.

Figure 2:
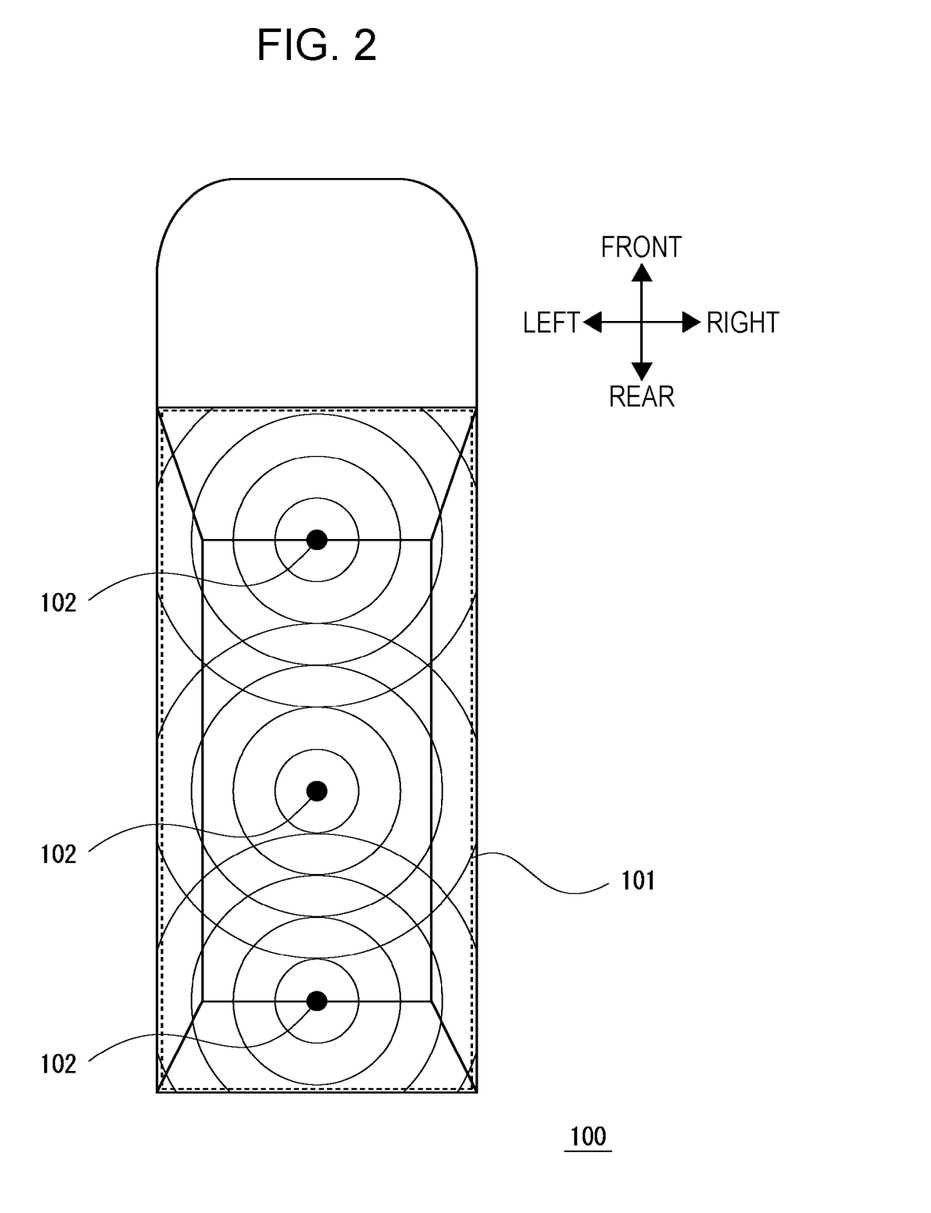
FIG. 2 illustrates an instance of disposition of cabin antennae in a cabin.

The cabin antennae 102 are disposed at, for instance, three positions in total, that is a front position, a middle position, and a rear position of the cabin 101 as illustrated in FIG. 2 so as to be substantially equally spaced from one another. The positions of the cabin antennae 102 are substantially at the center in a vehicle left-right direction. In FIG. 2, service areas of the cabin antennae 102 are schematically illustrated by arcs.

The vehicle 100 according to the present example is a vehicle having a cargo space 101b in the cabin such as a so-called hatchback or a so-called station wagon. According to the present example, a total of four seats 101a, that is, two seats 101a at the front and two seats 101a at the rear are disposed in the cabin 101. The cargo space 101b is formed in a portion located further to the rear side than the rear seats 101a.

The vehicle electric apparatus 1 is provided as an electric apparatus relating to the traction motor and includes therein the onboard battery 4 (not illustrated in FIG. 1) and an electric circuit unit 2 (not illustrated in FIG. 1) that includes a charging circuit 2a and so forth for charging the onboard battery 4.

According to the present example, the vehicle electric apparatus 1 is positioned below the cargo space 101b. That is, the vehicle electric apparatus 1 is installed in a space of the vehicle 100 outside the cabin 101. In one example, the space of the vehicle 100 outside the cabin 101 may serve as an "extra-cabin space".

The vehicle 100 has a charging port 103 provided with a connector for receiving the power from the external power source to the charging circuit 2a provided in the vehicle electric apparatus 1. According to the present example, the charging port 103 is positioned at a rear portion of a right side surface of the vehicle 100. Specifically, the position of the charging port 103 is superposed on the position of the vehicle electric apparatus 1 in a vehicle front-rear direction.

Figure 3:
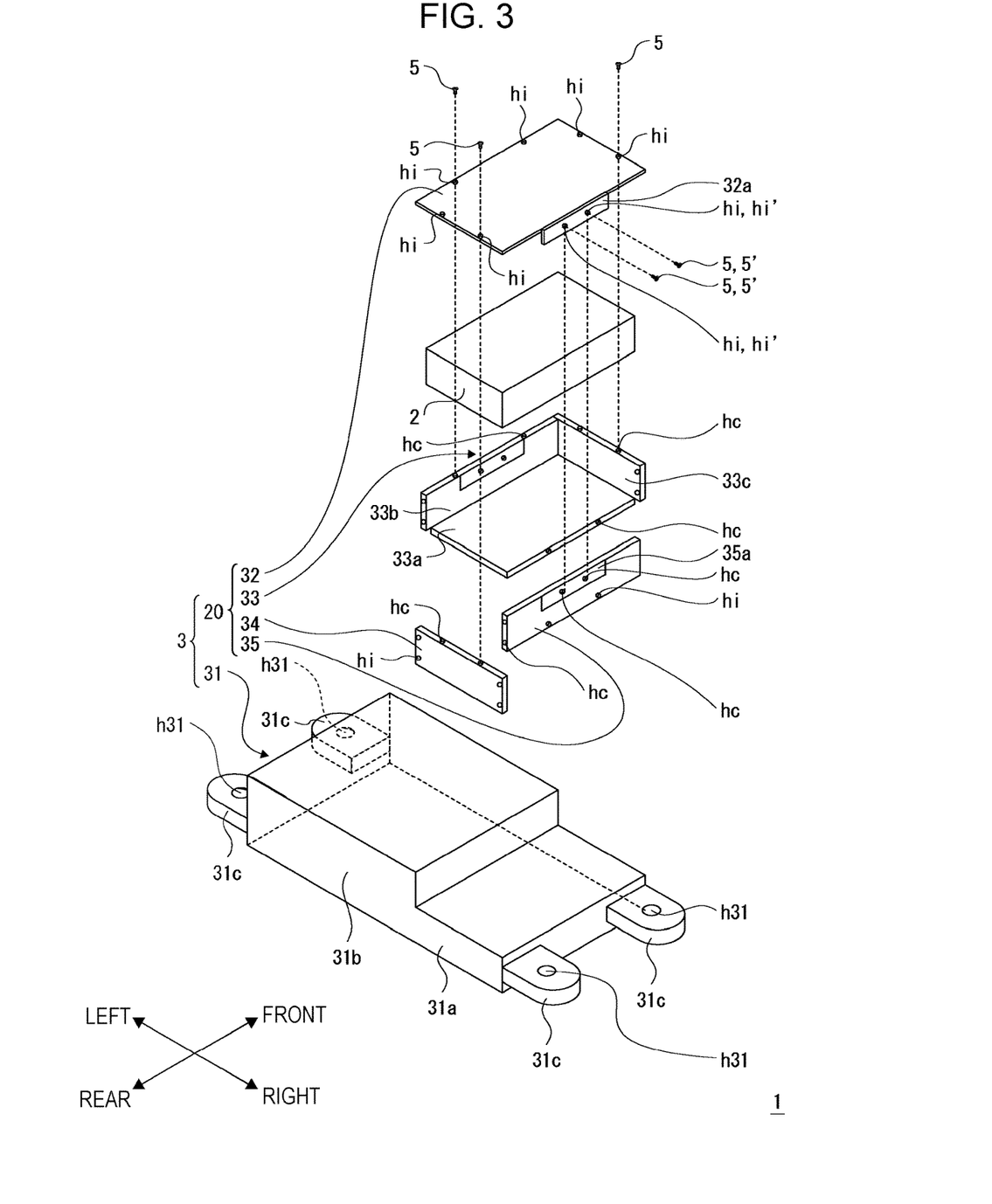
FIG. 3 is an exploded perspective view schematically illustrating a mechanical structure of the vehicle electric apparatus as the example.
Figure 4:
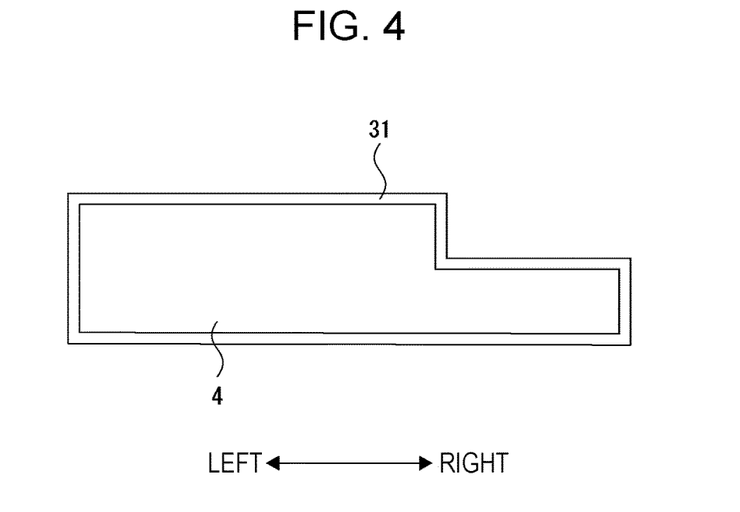
FIG. 4 is a sectional view of a battery housing part and an onboard battery housed in the battery housing part according to the example.
Figure 5:
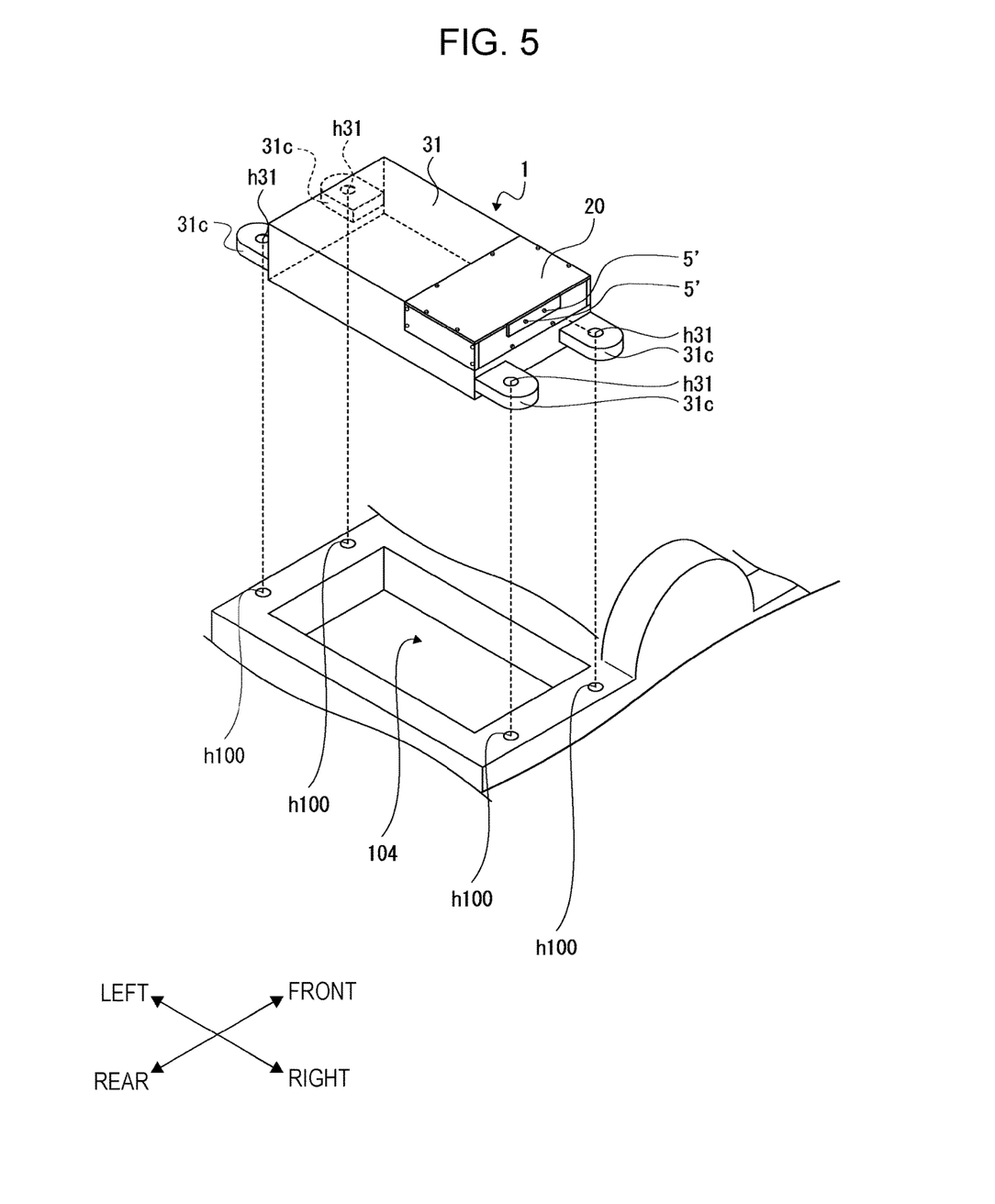
FIG. 5 illustrates a form of mounting on the vehicle the vehicle electric apparatus as the example.

Referring to FIGS. 3 to 5, a mechanical structure of the vehicle electric apparatus 1 and a form of mounting of the vehicle electric apparatus 1 on the vehicle 100 are described.

FIG. 3 is an exploded perspective view schematically illustrating the vehicle electric apparatus 1. FIG. 4 is a sectional view (sectional view taken along the left-right direction) of a battery housing part 31 provided in the vehicle electric apparatus 1 and the onboard battery 4 housed in the battery housing part 31. FIG. 5 illustrates a form of mounting the vehicle electric apparatus 1 on the vehicle 100.

The vehicle electric apparatus 1 includes the electric circuit unit 2, the onboard battery 4, and a metal housing 3. The electric circuit unit 2 and the onboard battery 4 are housed in the metal housing 3 (see FIGS. 3 and 4). The metal housing 3 is formed of, for instance, aluminum.

The metal housing 3 according to the present example includes the battery housing part 31, an upper housing part 32, a lower housing part 33, a rear housing part 34, and a right housing part 35. The onboard battery 4 is housed in the battery housing part 31. The electric circuit unit 2 is housed in a unit container 20 that includes the upper housing part 32, the lower housing part 33, the rear housing part 34, and the right housing part 35.

The onboard battery 4 is, for instance, a nickel-metal hydride battery or the like configured as a battery pack that includes therein multiple battery cells electrically connected in series or in parallel. The output voltage of the onboard battery 4 is a comparatively high voltage such as, for instance, some hundred volts.

The electric circuit unit 2 includes therein electric circuits such as the charging circuit 2a (not illustrated).

Examples of the electric circuits included in the electric circuit unit 2 include circuits such as the charging circuit 2a, an inverter circuit used for driving the traction motor, and a direct-current to direct-current (DC/DC) converter that steps down a supply voltage from the onboard battery 4 to obtain a power source voltage (for instance, 12 V system) for auxiliary devices. The charging circuit 2a and the DC/DC converter are electric circuits that include a switching unit that switches the direct currents.

Regarding the appearance of the battery housing part 31 of the metal housing 3, right end portion of the battery housing part 31 is reduced in thickness, and this thickness reduced portion is a thin portion 31a. A portion of the battery housing part 31 other than the thin portion 31a is a thick portion 31b. The thin portion 31a and the thick portion 31b have substantially rectangular shapes.

Although it is not illustrated, the battery housing part 31 actually includes multiple parts. Among these parts, parts adjacent to each other are secured to each other by, for instance, bar-shaped securing members such as bolts.

The battery housing part 31 according to the present example has projections 31c at four corners. Two of the projections 31c at the right end side of the battery housing part 31 (right end side of the thin portion 31a) project rightward. Two of the projections 31c at the left end side of the battery housing part 31 project leftward. An insertion hole h31 is provided at an end portion of each of the projections 31c in the projecting direction. The insertion hole h31 penetrates through the projection 31c in the up-down direction.

In the unit container 20, the upper housing part 32 covers the upper side of the electric circuit unit 2, and the rear housing part 34 and the right housing part 35 respectively cover the rear side and the right side of the electric circuit unit 2.

According to the present example, the lower housing part 33 includes a left surface portion 33b and a front surface portion 33c that respectively cover the left side and the front side of the electric circuit unit 2 in addition to a lower surface portion 33a that covers the lower side of the electric circuit unit 2. As illustrated in the drawing, the left surface portion 33*b* and the front surface portion 33*c* are coupled to the lower surface portion 33*a* and coupled to each other.

The upper housing part 32, the rear housing part 34, and the right housing part 35 are removably secured to the lower housing part 33 with, for instance, multiple bar-shaped securing members 5 as bolts. Furthermore, the upper housing part 32 are also removably secured to the rear housing part 34 and the right housing part 35 with, for instance, the multiple bar-shaped securing members 5. Furthermore, the rear housing part 34 and the right housing part 35 are removably secured to each other with the multiple bar-shaped securing members 5.

The upper housing part 32, the rear housing part 34, and the right housing part 35 have multiple insertion holes hi. The bar-shaped securing members 5 that secure the upper housing part 32, the rear housing part 34, and the right housing part 35 to the lower housing part 33 are inserted through the insertion holes h31.

The lower housing part 33 has securing recesses hc at positions corresponding to the insertion holes hi of the upper housing part 32, the rear housing part 34, and the right housing part 35. The securing recesses hc are screw holes into which, according to the present example, the bolts are screwed.

Furthermore, the rear housing part 34 has multiple insertion holes hi through which the bar-shaped securing members 5 that secure the rear housing part 34 to the right housing part 35 are inserted. The right housing part 35 has securing recesses hc at positions corresponding to the insertion holes hi of the rear housing part 34. Furthermore, the upper housing part 32 has multiple insertion holes hi through which the bar-shaped securing members 5 that secure the upper housing part 32 to the rear housing part 34 are inserted. The rear housing part 34 has securing recesses hc at positions corresponding to the insertion holes hi of the upper housing part 32.

As the insertion holes hi of the upper housing part 32, the insertion holes hi through which the bar-shaped securing members 5 that secure the upper housing part 32 to the lower housing part 33 and the rear housing part 34 are inserted are disposed at edges of the upper surface. These insertion holes hi penetrate through the upper housing part 32 in the substantially up-down direction.

In contrast, out of the insertion holes hi of the upper housing part 32, the insertion holes hi through which the bar-shaped securing members 5 that secure the upper housing part 32 to the right housing part 35 are inserted (hereafter, also referred to as "insertion holes hi'") are not formed in the upper surface according to the present example. Specifically, the upper housing part 32 has a bent portion 32*a* bent downward at a right end portion thereof. The insertion holes hi' are formed in this bent portion 32*a*. According to the present example, two insertion holes hi' are provided. The insertion holes hi' formed in the bent portion 32*a* penetrate through the bent portion 32*a* in the substantially left-right direction.

The right housing part 35 has a recess in an upper portion of a right side surface thereof. The recess is in contact with the bent portion 32*a* when the right housing part 35 is secured to the upper housing part 32. This recess is a receiving portion 35*a*. The receiving portion 35*a* has the securing recesses hc (according to the present example, two securing recesses hc are provided) to which the bar-shaped securing members 5 inserted through the insertion holes hi' of the bent portion 32*a* are secured.

In the unit container 20, the bar-shaped securing members 5 inserted through the insertion holes hi are secured to the corresponding securing recesses hc (screwed into the corresponding securing recesses hc according to the present example). Thus, the upper housing part 32, the lower housing part 33, the rear housing part 34, and the right housing part 35 are secured to one another.

At this time, when the number of securing positions with the bar-shaped securing members 5 is increased or securing pressures with the bar-shaped securing members 5 are increased, securing surface pressures between housing parts can be increased, and accordingly, a shielding effect against electromagnetic wave noise emitted from the electric circuit unit 2 can be increased.

Although the bent portion 32*a* has two insertion holes hi' according to the present example, the bent portion 32*a* may have a single insertion hole hi' or three or more insertion holes hi'.

The unit container 20 is mounted on the upper side of the thin portion 31*a* of the battery housing part 31 in the vehicle electric apparatus 1. According to the present example, a lower surface and a left surface of the unit container 20 mounted on the battery housing part 31 are respectively in contact with an upper surface of the thin portion 31*a* and a right surface of the thick portion 31*b*.

Although it is not illustrated, in order to mount the unit container 20 on the battery housing part 31, for instance, the lower surface portion 33*a* of the lower housing part 33 to which the upper housing part 32 has not yet been secured is secured to the upper surface of the thin portion 31*a* with the bar-shaped securing members 5 such as bolts.

In the vehicle electric apparatus 1 having the above-described structure, the electric circuit unit 2 housed in the metal housing 3 is positioned at a right end portion of the vehicle 100 in the metal housing 3. As described above, the charging port 103 is positioned at the rear portion of the right side surface of the vehicle 100. Accordingly, with the electric circuit unit 2 disposed as described above, the length of power feed wiring from the charging port 103 to the charging circuit 2*a* in the electric circuit unit 2 can be comparatively reduced.

Here, a receiving space 104 which is a downward recess is formed below the cargo space 101*b* at the rear portion of the vehicle 100 (see FIG. 5). According to the present example, the vehicle electric apparatus 1 is mounted in a vehicle body side with part thereof on the lower side received in the receiving space 104.

Insertion holes h100 are formed on the vehicle body side. The number of the insertion holes h100 is the same as the number of the insertion holes h31 of the projections 31*c*. The insertion holes h31 are aligned with the respective insertion holes h100. The vehicle electric apparatus 1 is secured to the vehicle body side with bar-shaped securing members (not illustrated) such as bolts inserted through the insertion holes h31 and the insertion holes h100. At this time, the battery housing part 31 is secured (coupled) to a rear portion of a right frame of the vehicle body with the bar-shaped securing members inserted through the insertion holes h31 of the projections 31*c* on the right side of the battery housing part 31 and the insertion holes h100 positioned corresponding to these insertion holes h31. Furthermore, the battery housing part 31 is secured (coupled) to a rear portion of a left frame of the vehicle body with the bar-shaped securing members inserted through the insertion holes h31 of the projections 31*c* on the left side of the battery housing part 31 and the insertion holes h100 positioned corresponding to these insertion holes h31. That is, the battery housing part 31 also functions as a coupler that couples the left frame and the right frame of the vehicle body frame to each other.

Thus, the metal housing 3 (lower housing part 33) of the vehicle electric apparatus 1 also functions as a reinforcing member that increases the rigidity of the vehicle body. This allows the number of components and the cost to be reduced and the volume of the cabin to be increased for obtaining a required level of rigidity of the vehicle body.

Here, the electromagnetic wave noise from the electric circuit unit 2 can leak even through small gaps between metal structures, that is, small gaps between the upper housing part 32, the lower housing part 33, the rear housing part 34, and the right housing part 35 according to the present example. In order to address this, these housing parts are secured by applying degrees of surface pressures using the bar-shaped securing members 5 such as bolts, thereby closing the gaps.

However, out of the electromagnetic wave noise emitted from the electric circuit unit 2, components of a low frequency band that are superposed on the low frequency (LF) band (about 100 to 150 kHz in particular) used for the keyless system are inductively coupled with the metal housing 3 and emitted through the bar-shaped securing members 5 the impedance of which is likely to increase.

At this time, a main component of the LF-band electromagnetic wave noise is a magnetic field, and accordingly, the electromagnetic wave noise has directivity. Specifically, the electromagnetic wave noise has directivity in the axial directions of the bar-shaped securing members 5. In so doing, radiant energy of the LF-band electromagnetic wave noise emitted through the bar-shaped securing members 5 is likely to be densified.

Due to these factors, the LF-band electromagnetic wave noise from the electric circuit unit 2 is emitted in particular directions, that is, in the axial directions of the bar-shaped securing members 5 as main emission directions by comparatively high energy through the bar-shaped securing members 5 as directional antennae.

As a result, when the axial directions of the bar-shaped securing members 5, in particular, directions in which the heads of the bolts are oriented are directions toward the inside of the cabin 101, a detection property of an electronic key is significantly degraded at particular positions in the cabin 101. In particular, when the cabin antennae 102 are positioned at the center in the left-right direction of the vehicle 100 as in the present example, the detection property of the cabin antennae 102 reduces toward end portions of the cabin 101 in the left-right direction. Accordingly, when the electric circuit unit 2 is disposed at a position spaced from the center in the left-right direction in the vehicle electric apparatus 1 as illustrated in, for instance, FIG. 3, the electronic key placed near the electric circuit unit 2 is likely to be lost.

When the electronic key placed in the cabin 101 is lost, a so-called "key confinement (locking the key in the vehicle)" may occur. Specifically, key confinement may occur when a user places an electronic key near the electric circuit unit 2 in the cabin 101 while the user performing charging work from the external power source and closes the door in this state. Some keyless systems automatically lock the door when the door is closed and the electronic key is not detectable by the cabin antennae 102 (on the assumption that the user leaves the vehicle and closes the door). With such a system, key confinement occurs when the key is lost as described above.

Furthermore, in the case where the electronic key in the cabin 101 is lost, even when the user operates a startup instruction operating device such as a start button, a vehicle control system is not necessarily able to be started up against the intention of the user.

According to the present example, the following structure is used to prevent such malfunctioning of the keyless system due to losing of the electronic key: the axial directions of the bar-shaped securing members 5 used in at least some of the securing positions with the bar-shaped securing members 5 in the metal housing 3 are orientated such that the emission directions of the electromagnetic waves from the electric circuit unit 2 through the bar-shaped securing members 5 are oriented toward the outside of the cabin 101.

Specifically, according to the present example, the upper housing part 32 has the bent portion 32*a*, and the insertion holes hi (hi') is formed so as to penetrate through the bent portion 32*a* in the left-right direction of the vehicle 100. With this structure, the axial direction of the bar-shaped securing members 5 that secure the upper housing part 32 to the right housing part 35 through the insertion holes hi' is set to be coincident with the left-right direction of the vehicle 100 (see the bar-shaped securing members 5 denoted by "5'" in FIGS. 3 and 5). Hereafter, the bar-shaped securing members 5 used for securing through the insertion holes hi' are also referred to as "bar-shaped securing members 5'".

With the above-described structure, the emission direction of the electromagnetic waves from the electric circuit unit 2 through the bar-shaped securing members 5' is oriented toward the outside of the cabin 101 at the securing positions which are close to the electric circuit unit 2 and at which the detection property of the cabin antennae 102 is comparatively reduced out of the securing positions with the bar-shaped securing members 5 in the metal housing 3.

Accordingly, even when the electronic key is placed in the cabin 101, losing of the electronic key due to the effect of the electromagnetic wave noise can be prevented.

Here, as can be understood from the above description, electromagnetic waves are emitted from the electric circuit unit 2 to the outside of the metal housing 3 through the bar-shaped securing members 5 because no shielding is provided for an end portion of each of the bar-shaped securing members 5 near the outer side of the metal housing 3 out of both end portions of the bar-shaped securing member 5 in the axial direction. Hereafter, out of the end portions of each of the bar-shaped securing members 5 in the axial direction, an end portion near the outer side of the metal housing 3 is referred to as an "outer end" and the opposite end portion to the outer end is referred to as an "inner end".

In order to prevent losing of the electronic key, it is sufficient that, when a line segment between the inner end and the outer end is extended from the outer end, the cabin 101 is not located on an extended portion of the line segment on the outer end side. In other words, it is sufficient that the bar-shaped securing members 5 is oriented in a direction that satisfies the above condition. The direction of the bar-shaped securing members 5' illustrated in FIG. 3 (oriented such that the axial direction is coincident with the left-right direction) satisfies the above-described condition. This prevents emission of the electromagnetic wave from the electric circuit unit 2 toward the inside of the cabin 101 through the bar-shaped securing members 5', and accordingly, prevents losing of the electronic key.

Figure 6:
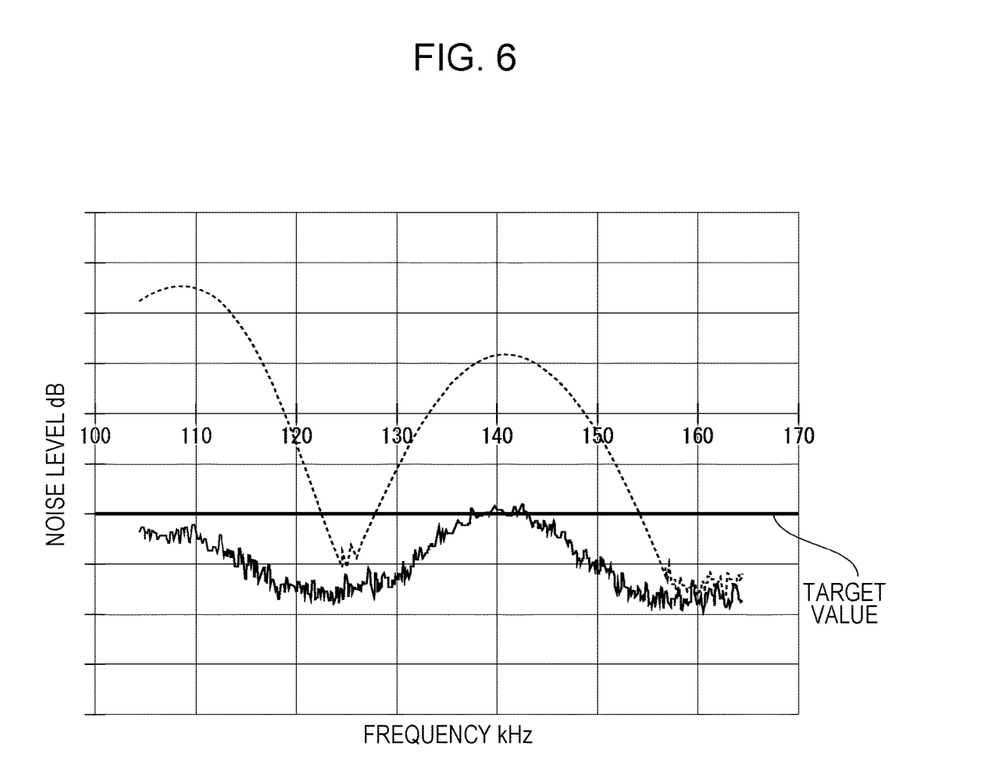
FIG. 6 illustrates a result of an experiment on the shielding effect against the electromagnetic wave noise.

FIG. 6 illustrates a result of an experiment on the shielding effect against the electromagnetic wave noise. In FIG. 6, noise level characteristics are drawn with the noise level represented along the vertical axis and the frequency represented along the horizontal axis. Also in FIG. 6, a thick solid line represents the noise level characteristic as the target value, a thin solid line represents the noise level characteristic observed with the vehicle electric apparatus 1 according to the example, and a thin broken line represents the related-art noise level characteristic (observed when the axial direction of the bar-shaped securing members 5 extends in the up-down direction).

As described above, with the vehicle electric apparatus 1 according to the example, the noise level is reduced to a lower level than that of the related art, and an experimental value substantially lower than the target value of the noise level is obtained in the LF-band, in particular, in the frequency band of about 100 to 150 kHz (radio wave band used for the keyless system).

As an instance of fastening positions for orienting the emission directions of the electromagnetic waves through the bar-shaped securing members 5 toward the outside of the cabin 101 (hereafter, these fastening positions are referred to as "target fastening positions"), fastening positions at the right end portion of the metal housing 3 has been described. However, the target fastening positions may be set at any positions with consideration of the actual effect of the electromagnetic wave noise on the keyless system. For instance, when the shielding effect against the electromagnetic wave noise is prioritized, all the fastening positions can be set to be the target fastening positions.

In any case, when at least some (one) of the multiple fastening positions in the metal housing 3 is set to be the target fastening position, the amount of noise emitted from the electric circuit unit 2 to the outside of the vehicle electric apparatus 1 can be reduced. That is, probability of malfunctioning of the keyless system due to the electromagnetic wave noise can be reduced.

Furthermore, bolts are used as the bar-shaped securing members 5 according to the above-described example. Alternatively, other securing members having a bar shape such as, for instance, knock-pins or rivets may be used as the bar-shaped securing members 5.

Furthermore, although the metal housing 3 includes five housing parts (the battery housing part 31, the upper housing part 32, the lower housing part 33, the rear housing part 34, and the right housing part 35) according to the above-described example, the number of housing parts included in the metal housing 3 is not limited to five. It is sufficient that the metal housing 3 include multiple housing parts. Also in such a case, the adjacent housing parts of the metal housing 3 are secured to one another with the bar-shaped securing members 5 at multiple securing positions.

Furthermore, although an instance of the vehicle electric apparatus 1 in which the electric circuit unit 2 and the onboard battery 4 are housed in the metal housing 3 has been described, it is sufficient that the vehicle electric apparatus 1 have a configuration in which at least the electric circuit unit 2 including the switching unit is housed in the metal housing 3.

Furthermore, the space where the vehicle electric apparatus 1 is disposed is not limited to the extra-cabin space in the rear portion of the vehicle 100. For instance, the vehicle electric apparatus 1 may be disposed in an extra-cabin space at the front portion or the like of the vehicle 100. It is sufficient that the vehicle electric apparatus 1 be disposed in a space outside the cabin of the vehicle 100.

Figure 7A:
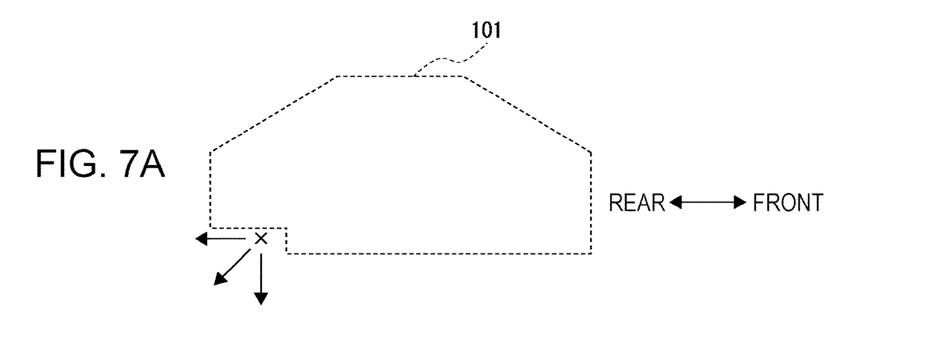
FIGS. 7A and 7B illustrate instances of the axial directions of bar-shaped securing members for orienting emission directions of electromagnetic waves toward the outside of the cabin.
Figure 7B:
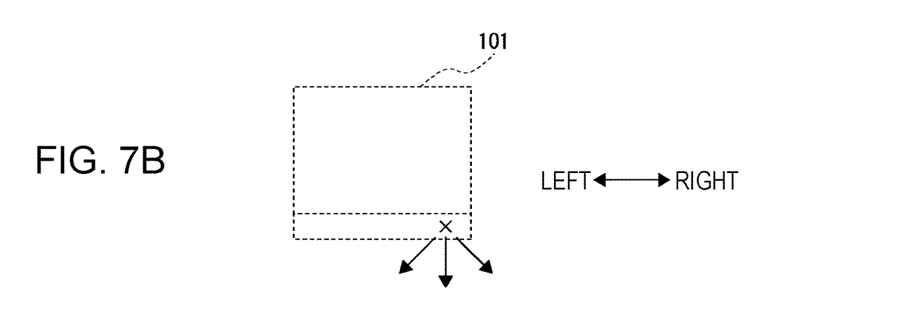
Figure 8:
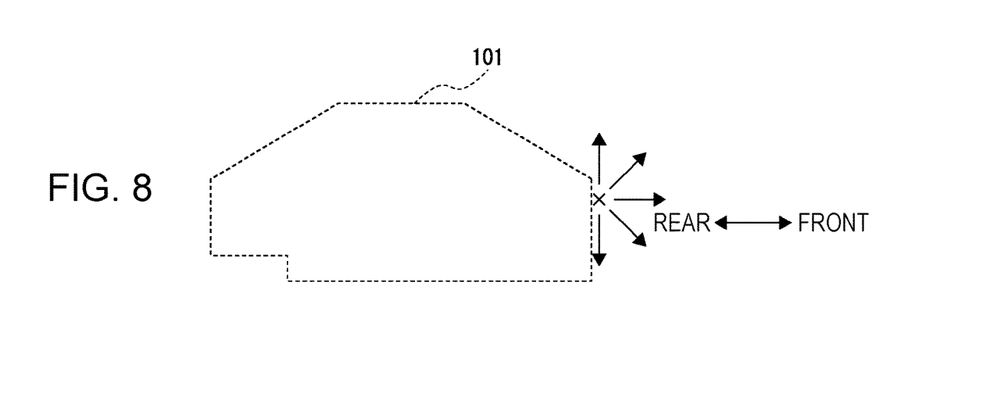
FIG. 8 illustrates, as in FIGS. 7A and 7B, instances of the axial directions of the bar-shaped securing members for orienting the emission directions of electromagnetic waves toward the outside of the cabin.

FIGS. 7A, 7B, and 8 illustrate instances of the axial directions of the bar-shaped securing members 5 for orienting the emission directions of electromagnetic waves toward the outside of the cabin 101.

In FIGS. 7A and 8, the relationships between the cabin 101, the target fastening positions in the metal housing 3 (schematically represented by "x" marks in the drawings), and the emission directions of electromagnetic waves through the bar-shaped securing members 5 at the target fastening positions are observed from the right side of the vehicle 100. In FIG. 7B, the above-described relationships are observed from the rear side of the vehicle 100.

FIGS. 7A and 7B illustrate instances when the target fastening positions are disposed below the cabin 101 as is the case with the vehicle electric apparatus 1 illustrated in FIG. 3. In this case, the axial direction of the bar-shaped securing members 5 can be set so that the emission direction of the electromagnetic waves is oriented toward, for instance, a rear side, a diagonally lower rear side, a lower side, a diagonally left lower side, or a diagonally right lower side of the vehicle 100.

FIG. 8 illustrates instances of the axial directions of the bar-shaped securing members 5 when the vehicle electric apparatus 1 is disposed in the extra-cabin space at the front portion of the vehicle 100. In this case, the axial direction of the bar-shaped securing members 5 can be set so that the emission direction of the electromagnetic waves is oriented toward, for example, an upper side, a lower side, a front side, a diagonally upper front side, a diagonally lower front side, a left side (not illustrated), or a right side (not illustrated) of the vehicle 100.

As described above, it is sufficient that the axial direction of the bar-shaped securing members 5 be determined so that the emission direction of the electromagnetic waves through the bar-shaped securing members 5 is oriented toward the outside of the cabin 101 in accordance with the positional relationship between the target fastening positions and the cabin 101.

When the electric circuit unit 2 includes the charging circuit 2a, in order to dispose the vehicle electric apparatus 1 in the extra-cabin space at the front portion of the vehicle 100, it is desirable that the electric circuit unit 2 be positioned at a front end portion of the metal housing 3 in the front-rear direction of the vehicle 100. With this structure, when the charging port 103 is provided at a front end portion of the vehicle 100, the length of the power feed wiring from the charging port 103 to the charging circuit 2a is easily reduced.

Here, the electric circuit unit 2 may be positioned at a left end portion of the metal housing 3 in the left-right direction of the vehicle 100 or a rear end portion of the metal housing 3 in the front-rear direction of the vehicle 100 corresponding to the case where the charging port 103 is provided in a left side surface or at a rear end portion of the vehicle 100, respectively. Also in this case, the length of the power feed wiring from the charging port 103 to the charging circuit 2a is easily reduced.

When the length of the power feed wiring from the charging port 103 to the charging circuit 2a is reduced, wiring impedance can be reduced, and accordingly, charging efficiency can be improved. Furthermore, due to the reduction of the wiring length, it is difficult for the power feed wiring to the charging circuit to pick up noise. This can reduce the effect of external noise on the charging circuit.

As has been described, the vehicle electric apparatus (1) according to the example is installed in an extra-cabin (101) space in a vehicle (100) and includes an electric circuit unit (2) and a metal housing (3). The electric circuit unit includes a switching unit configured to switch a direct-current voltage. The metal housing houses the electric circuit unit. The metal housing includes a multiple housing parts (31, 32, 33,

34, and 35), and adjacent housing parts out of the multiple housing parts are secured to one another at multiple securing positions with respective bar-shaped securing members (5). An axial direction of at least one bar-shaped securing member (5') out of the bar-shaped securing members used for the at least one securing position out of the multiple securing positions is set so as to orient toward an outside of a cabin an emission direction of an electromagnetic wave from the electric circuit unit through the at least one bar-shaped securing member.

With the above-described structure, the amount of electromagnetic wave noise emitted from the vehicle electric apparatus toward the inside of the cabin is reduced. Accordingly, malfunctioning of the keyless system caused by the electromagnetic wave noise emitted from the vehicle electric apparatus can be prevented.

Furthermore, since the electromagnetic wave noise can be effectively reduced, a required noise reduction amount can be obtained while it is not required to increase the thickness of a plate of the metal housing. Thus, the thickness of the metal housing can be reduced. Thus, the volume of the cabin can be increased, and the weight of the vehicle can be reduced.

Furthermore, the require noise reduction amount can be obtained while it is not required to increase airtightness between the housing parts. Thus, the number of fastening positions with the bar-shaped securing members can be reduced. Accordingly, work efficiency of the assembly of the vehicle electric apparatus can be improved, and the weight and the cost of the vehicle can be reduced.

Furthermore, shielding of exposed portions of the bar-shaped securing members from the metal housing is not required. Thus, shielding components can be reduced. Also in this regard, the weight and the cost of the vehicle can be reduced due to reduction of the number of components.

Furthermore, there is no need of an increase in the number of antennae which would otherwise be required as an anti-noise measure to prevent malfunction. Also in this regard, the number of components and the cost can be reduced.

Furthermore, in the vehicle electric apparatus according to the example, the electric circuit unit includes a charging circuit configured to charge an onboard battery (4).

The frequency band of the electromagnetic wave emitted from the charging circuit is close to the frequency band used for the keyless system.

Accordingly, the anti-noise measure according to the example of the present invention is particularly preferable.

Furthermore, in the vehicle electric apparatus according to the example, each of the bar-shaped securing members has an outer end located near an outer side of the metal housing in the axial direction and an inner end being an opposite end to the outer end in the axial direction. The at least one bar-shaped securing member used for the at least one securing position is oriented such that, when a line segment between the inner end and the outer end is extended from the outer end, the cabin is not located on an extended portion of the line segment on the outer end side.

This can reduce the amount of electromagnetic wave noise emitted toward the inside of the cabin from the end portions of the bar-shaped securing members out of the end portions of the bar-shaped securing member for which the shielding effect produced by the metal housing cannot be obtained.

Accordingly, malfunctioning of the keyless system caused by the electromagnetic wave noise emitted from the vehicle electric apparatus can be prevented.

Furthermore, in the vehicle electric apparatus according to the present example, the electric circuit unit is positioned at an end portion of the metal housing close to a front end, a rear end, a left end, or a right end of the vehicle, and the at least one securing position is positioned at an end portion side of the metal housing where the electric circuit unit is positioned.

In a PHEV, the charging port of the onboard battery is typically provided at a front, rear, left, or right end portion of the vehicle. When the electric circuit unit including the charging circuit is positioned at the front, rear, left, or right end portion of the metal housing as described above, the charging circuit is easily positioned near the charging port.

Thus, the length of the power feed wiring from the charging port to the charging circuit is reduced. This can reduce wiring impedance, and accordingly, charging efficiency can be improved. Furthermore, due to the reduction of the wiring length, it is difficult for the power feed wiring to the charging circuit to pick up noise. This can reduce the effect of external noise on the charging circuit.

Furthermore, according to the above-described structure, at the at least one securing position on the end portion side of the metal housing where the electric circuit unit is provided, the at least one bar-shaped securing member is oriented such that the emitting direction of the electromagnetic wave is oriented toward the outside of the cabin.

This allows the amount of the emitted electromagnetic wave noise to be reduced on the end portion side where the amount of the emitted electromagnetic wave noise tends to increase. Thus, the effect of preventing malfunctioning of the keyless system due to the electromagnetic wave noise can be improved.

Furthermore, in the vehicle electric apparatus according to the present example, the metal housing covers the electric circuit unit and the onboard battery. The at least one securing position is positioned on an electric circuit unit side. The at least one bar-shaped securing member used for the at least one securing position is oriented such that, when the line segment between the inner end and the outer end is extended from the inner end, the onboard battery is located on an extended portion of the line segment on an inner end side.

Thus, the electric circuit unit and the onboard battery are housed in the metal housing. In addition, the at least one bar-shaped securing member is oriented such that the emission direction of the electromagnetic wave is oriented toward the outside of the cabin at the at least one securing position on the side of the metal housing where the electric circuit unit is provided.

This allows the amount of the emitted electromagnetic wave noise to be reduced on the side of the metal housing where the amount of the emitted electromagnetic wave noise tends to increase. Thus, the effect of preventing malfunctioning of the keyless system due to the electromagnetic wave noise can be improved.

Furthermore, in the vehicle electric apparatus according to the present example, the axial direction of the at least one bar-shaped securing member used for the at least one securing position out of the multiple securing positions is substantially coincident with a left-right direction of the vehicle.

Thus, when the vehicle electric apparatus is positioned below or in front of the cabin, the emission direction of the electromagnetic wave is oriented toward the outside of the cabin, and accordingly, the amount of the electromagnetic wave noise emitted from the electric circuit unit toward the inside of the cabin is reduced. Accordingly, malfunctioning of the keyless system caused by the electromagnetic wave noise emitted from the vehicle electric apparatus can be prevented.

The present invention is not limited to the above-described specific example and can be configured in various manners.

For instance, although the example of the present invention is used for a vehicle as a PHEV in the above description, the example of the present invention can also be preferably used for a vehicle as an HEV or an electric vehicle without an engine.

The invention claimed is:

1. A vehicle electric apparatus configured to be installed in an extra-cabin space in a vehicle, the apparatus comprising:

an electric circuit unit that comprises a switching unit configured to switch a direct-current voltage; and a metal housing that houses the electric circuit unit, wherein the metal housing comprises multiple housing parts, and adjacent housing parts out of the multiple housing parts are secured to one another at multiple securing positions with respective bar-shaped securing members, and wherein, an axial direction of at least one bar-shaped securing member out of the bar-shaped securing members used for at least one securing position out of the multiple securing positions is set so as to orient toward an outside of a cabin an emission direction of an electromagnetic wave from the electric circuit unit through the at least one bar-shaped securing member, wherein the electric circuit unit comprises a charging circuit configured to charge an onboard battery, wherein each of the bar-shaped securing members has an outer end and an inner end, the outer end being located near an outer side of the metal housing in the axial direction, the inner end being an opposite end to the outer end in the axial direction, wherein the at least one bar-shaped securing member used for the at least one securing position is oriented such that, when a line segment between the inner end and the outer end is extended from the outer end, the cabin is not located on an extended portion of the line segment on the outer end side, wherein the metal housing covers the electric circuit unit and the onboard battery, wherein the at least one securing position is positioned on an electric circuit unit side, and wherein the at least one bar-shaped securing member used for the at least one securing position is oriented such that, when the line segment between the inner end and the outer end is extended from the inner end, the onboard battery is located on an extended portion of the line segment on an inner end side.

2. The vehicle electric apparatus according to claim 1, wherein the electric circuit unit is positioned at an end portion of the metal housing close to a front end, a rear end, a left end, or a right end of the vehicle, and wherein the at least one securing position is positioned at an end portion side of the metal housing where the electric circuit unit is positioned.

3. The vehicle electric apparatus according to claim 2, wherein the axial direction of the at least one bar-shaped securing member used for the at least one securing position out of the multiple securing positions is substantially coincident with a left-right direction of the vehicle.

4. The vehicle electric apparatus according to claim 1, wherein the axial direction of the at least one bar-shaped securing member used for the at least one securing position out of the multiple securing positions is substantially coincident with a left-right direction of the vehicle.

* * * * *